United States Patent
Schwartz et al.

(10) Patent No.: US 6,645,644 B1
(45) Date of Patent: Nov. 11, 2003

(54) ENHANCED BONDING OF PHOSPHORIC AND PHOSPHORIC ACIDS TO OXIDIZED SUBSTRATES

(75) Inventors: Jeffrey Schwartz, Princeton, NJ (US); Ellen Gawalt, Princeton, NJ (US); Michael Avaltroni, Staten Island, NY (US)

(73) Assignee: The Trustees of Princeton University, Princeton, NJ (US)

( * ) Notice: Subject to any disclaimer, the term of this patent is extended or adjusted under 35 U.S.C. 154(b) by 389 days.

(21) Appl. No.: 09/668,080

(22) Filed: Sep. 22, 2000

Related U.S. Application Data

(63) Continuation-in-part of application No. 08/794,833, filed on Feb. 4, 1997, now Pat. No. 6,146,767.
(60) Provisional application No. 60/028,949, filed on Oct. 17, 1996, provisional application No. 60/035,040, filed on Jan. 13, 1997, and provisional application No. 60/155,398, filed on Sep. 22, 1999.

(51) Int. Cl.[7] .......................... B32B 15/04; B32B 19/04; B32B 15/00; A61F 2/28; A61F 2/02
(52) U.S. Cl. ........................ 428/632; 428/704; 428/450; 428/639; 428/660; 428/338; 428/472.3; 623/16.11; 623/23.76
(58) Field of Search .......................... 623/16.11, 23.76, 623/20.14, 22.11; 428/704, 627, 632, 634, 639, 640, 660, 662, 663, 664, 665, 666, 687, 338, 409, 469, 470, 472, 472.1, 472.3, 450, 543

(56) References Cited

U.S. PATENT DOCUMENTS

| | | | |
|---|---|---|---|
| 3,772,355 A | 11/1973 | Merz | 260/429 R |
| 4,403,941 A | 9/1983 | White et al. | 431/10 |
| 4,830,993 A | 5/1989 | Legrand et al. | 501/103 |
| 4,909,846 A | 3/1990 | Barfurth et al. | 106/22 |
| 4,929,589 A * | 5/1990 | Martin et al. | 502/406 |
| 5,185,208 A | 2/1993 | Yamashita et al. | 428/411.1 |
| 5,231,151 A | 7/1993 | Spencer | 526/116 |
| 5,279,720 A | 1/1994 | Divigalpitiya | 204/181.5 |
| 5,286,571 A | 2/1994 | Mirkin et al. | 428/428 |
| 5,397,642 A | 3/1995 | Li | 428/403 |
| 5,767,032 A | 6/1998 | Hokkanen et al. | 502/108 |

FOREIGN PATENT DOCUMENTS

| | | |
|---|---|---|
| JP | 2018463 | 1/1989 |
| JP | 5224448 | 9/1993 |

OTHER PUBLICATIONS

Seto, "Stabilization of Self–Assembled Monolayers on Native Oxides," (Princeton University 1995), (May).

Gagliardi et al., "Pre–Resonance Raman Characterization of Metal–Organic Films From Titanium Alkoxide Carboxylate Complexes," *Mat. Res. Soc. Syp. Proc., 180*, 801–805 (1990) (no month).

Laibimis et al., "Orthogonal Self–Assembled Mono–Layers: Alkanethiols on Gold and Alkane Carboxylic Acids on Alumina," *Science, 245*, 845 (1989) (Aug.).

Miller et al., "The Importance of Liquid Kinetic Basicity on the Preparation of Surface Supported Zirconium Complexes by Proton Transfer from Hydroxylated Aluminum on Silicon," *J. Am. Chem. Soc., 115*, 8239–8247 (1993) (no month).

\* cited by examiner

*Primary Examiner*—Michael La Villa
(74) *Attorney, Agent, or Firm*—Synnestvedt & Lechner LLP

(57) ABSTRACT

Ligand-containing coating layers on the surface of hydroxide-bearing substrates comprising transition metal atoms selected from the group consisting of Group IVB, Group VB and Group VIB of the Periodic Chart covalently bonded to the surface hydroxyls of said substrate, wherein each transition metal atom is further covalently bonded to one or more ligands of said coating layer, thereby covalently bonding said coating layer to said substrate. Disclosed ligands include inorganic phosphates and organic phosphonates.

13 Claims, No Drawings

ENHANCED BONDING OF PHOSPHORIC AND PHOSPHORIC ACIDS TO OXIDIZED SUBSTRATES

CROSS REFERENCE TO RELATED APPLICATIONS

The present application is a Continuation-In-Part and a Divisional filed Feb. 4, 1997 of U.S. Pat. No. 6,146,767 which issued Nov. 14, 2000 from U.S. patent application Ser. No. 08/794,833, which application, in turn, claims priority from U.S. Provisional Patent Application Serial Nos. 60/028,949 filed Oct. 17, 1996 and 60/035,040 filed Jan. 13, 1997. The present application also claims priority from U.S. Provisional Patent Application Serial No. 60/155,398 filed Sep. 22, 1999. The disclosures of all four applications are incorporated herein by reference.

FIELD OF THE INVENTION

The present invention relates to organic phosphonate and inorganic phosphate coatings covalently bonded to substrates having hydroxide-bearing surface layers. The present invention further relates to implantable medical devices having hydroxide-bearing surface layers covalently bonded to the organic phosphonate and inorganic phosphate coatings, which provide an osteoconductive surface on the medical device. In addition, the present invention relates to methods for forming such coatings, particularly on the surface of implantable medical devices having hydroxide-bearing surface layers, to provide an osteoconductive surface.

BACKGROUND ART

Creating a stable bond between bone tissue and the surface of metallic bone implants is a research topic of considerable interest. Poor bonding with the interface between the metallic surface of the implant and the bone tissue leads to low mechanical strength of the bone-to-implant junction and the possibility of subsequent implant failure.

Titanium and titanium alloys are used extensively as dental and orthopedic implants. Currently, there is no effective way to obtain strong attachment of incipient bone with the implant material at the interface between the surfaces of the two materials in order to "stabilize" the implant.

An important goal for interface optimization is to use species which are biocompatible and which enable bone mineralization at the interface following implantation. Bone tissue is a combination of protein and mineral content, with the mineral content being in the form of hydroxyapatite.

The problem of interface synthesis is often approached from the prospective of high temperature methods, including using plasma or laser-induced coating techniques. However, these methods engender problems of implant heating and surface coverage. For example, calcium phosphate deposition at high temperatures can give rise to ion migration. Plasma-induced phosphate coating of a titanium substrate gives surface hydroxyapatite as well as surface calcium phosphate, titanates and zirconates. Therefore, control of surface stoichiometry can be problematic, and defects at the interface may translate into poor mechanical strength.

The use of intermediate layers, for example of zirconium dioxide, to enhance hydroxyapatite adhesion and interface mechanical strength has been explored with success. However, a practical limitation involving laser or plasma deposition is that it is hard to obtain comprehensive coverage on a titanium implant of complex 3-dimensional structure. The zirconium dioxide interface formed at high temperatures is of low surface area and maintains few, if any, reactive functional groups for further surface modification chemistry.

Solution-phase surface processing does not suffer from the practical limitations of surface coverage that can be attendant with plasma or laser-based deposition methods, and procedures involving formation of hydroxyapatite from solution, often using sol-gel type processing, have been accomplished. Elegant methodologies have been developed in which graded interfaces have been prepared, extending from the pure implant metal to the biomaterial at the outer extremity by way of silicates. However, while solution-based procedures are inexpensive and give rise to materials resistant to dissolution by bodily fluids, adhesion of the hydroxyapatite to the implant metal is less strong than is observed when deposition is accomplished by plasma spraying techniques.

A need exists for a methodology that combines the benefits of the physical deposition of interfacial zirconium dioxide with the coverage, processing and speciation control of solution-based methods.

SUMMARY OF THE INVENTION

This need is met by the present invention. It has now been found that alkoxides of transition metals selected from Group IVB, Group VB and Group VIB of the Periodic Chart adhere to hydroxide-bearing substrate surfaces with relative ease. Such transition metal alkoxides thus may be used to form osteoconductive interfaces between bone tissue and implant materials. In particular, the transition metal alkoxides covalently bond phosphates and phosphonates to the surface hydroxyls of the implant substrate, which in turn provide an osteoconductive surface imparting enhanced mechanical strength and stability to bone-to-metal implant interaction. The phosphate or phosphonate interface functions to nucleate the growth of hydroxyapatite, thereby minimizing implant failure and the attendant need for serial revision implant surgery, which can be a consequence of unstable implant-to-bone interaction.

Therefore, in accordance with one embodiment of the present invention, there is provided a surface layer on a hydroxide bearing substrate, wherein transition metal atoms selected from Group IVB, Group VB or Group VIB of the Periodic Chart are covalently bonded to the surface hydroxyls of the substrate, and each transition metal atom is further covalently bonded to one or more ligands, thereby covalently bonding the ligands to the substrate surface. Preferred ligands include phosphate ligand, organic ligands of carboxylic and phosphonic acids containing between 2 and 20 carbon atoms, and ligands of pi-electron delocalized compounds. The phosphonic acid ligand may be functionalized to promote bonding to the protein content of bone tissue. Preferred pi-electron delocalized compounds include aromatic ring compounds with the preferred ligand being a phenolate.

Hydroxide-bearing substrates suitable for use with the present invention includes substrates having a native oxide surface layer, including the native oxide layers of metals and metal alloys. Single or mixed metal oxides may also be used. Native oxide layers of metalloids such as silicon are also appropriate. Surface modified ceramics and polymeric plastics may also be used.

While not being bound by any particular theory, it is believed, under ambient conditions, that in the absence of a transition metal atom interface, the ligands adhere to substrate hydroxides by hydrogen bonding, which is a weak interaction. The introduction of a transition metal interface makes a significant difference in the stability of the ligand surface layer by covalently bonding the ligand to the substrate surface. In particular, phosphoric and phosphonic acids react instantaneously and irreversibly under ambient conditions with surface-bound transition metal alkoxides to provide strong adhesion of the organic ligand layer to the surface. No such adhesion exists in the absence of the transition metal interface under ambient reaction conditions.

The present invention also provides a method by which ligands may be covalently bonded to the surface of hydroxide-bearing substrates. In accordance with this embodiment of the present invention, there is provided a method of forming a ligand layer on the surface of a hydroxide bearing substrate, which method includes the steps of:

providing a hydroxide-bearing substrate having a surface layer of alkoxides of transition metals selected from Group IVB, Group VB or Group VIB of the Periodic Chart covalently bonded thereto, wherein the alkoxides are bonded at the transition metal atoms to the surface hydroxyls of the substrate overlayer; and reacting the transition metal alkoxide surface layer with a compound capable of reacting with the transition metal alkoxide to form a ligand covalently bonded to the transition metal, thereby forming a ligand layer on the surface of the substrate, covalently bonded at the transition metal atoms to the surface hydroxyls of the substrate.

Phosphate ligands are obtained by using phosphoric acid. Phosphonate ligands are obtained using organic phosphonates.

The hydroxide-bearing substrate is preferably provided with a transition metal alkoxide surface layer by reacting the substrate with a polyalkoxide of the transition metal having two or more alkoxide groups, so that the transition metal alkoxide surface layer is formed, covalently bonded to at least one surface hydroxyl of the substrate, and having at least one unreacted alkoxide group.

When phosphoric acid is used, transition metal monophosphate esters are formed that may be hydrolyzed to provide an inorganic transition metal polyphosphate coating. The coating structure is a two-dimensional network that on the surface of a dental or orthopedic implant is suitable for the ingrowth of bone tissue hydroxyapatite. Therefore, according to another embodiment of this aspect of the invention, the method of forming a ligand layer further includes the step of hydrolyzing a transition metal monophosphate ester surface layer so that an inorganic transition metal polyphosphate coating is formed on the substrate surface. Both the monophosphate and polyphosphate layers are rich in hydroxyl groups that are available for further chemical modification.

In a particularly preferred embodiment, phosphonic acids are chosen that form coatings, the organic ligand portions of which are functionalized at the omega-carbon to form covalent bonds with chemical precursors of bone tissue protein, such as amino acids, or with the bone tissue protein itself. The coatings typically self-assemble with the omega-carbon directed away from the substrate surface and available for covalent bonding or further chemical modification. Preferred omega-functional groups include amino, carboxylate and thiol groups.

This embodiment of the present invention thus obtains the adhesion properties of physical deposition methods under mild reaction conditions. In particular, the coatings according to this embodiment of the invention may be formed at ambient temperatures.

However, it has also been discovered that phosphate and phosphonate coatings may be directly covalently bonded to hydroxide-bearing substrates. The phosphate coatings are formed by heating substrates coated with phosphoric acid, while the phosphonate coatings are formed by heating substrates coated with organic phosphonic acids.

Therefore, in accordance with another embodiment of the present invention, there is provided a ligand surface layer on a hydroxide-bearing substrate in which phosphate or phosphonate ligands are covalently bonded to the substrate. The heating polymerizes the phosphonate ligands to form an organopolyphosphonate coating.

The present invention thus also provides a method by which phosphate and phosphonate ligands may be covalently bonded to this surface of hydroxide-bearing substrates. In accordance with this embodiment of the present invention, there is provided a method of forming a phosphate or phosphonate ligand layer covalently bonded to the surface of a hydroxide-bearing substrate, which method includes the steps of:

coating a hydroxide-bearing substrate with phosphoric acid or an organic phosphonic acid; and heating the coated substrate until the phosphoric acid or organic phosphonic acid covalently bonds to the substrate.

When the substrate is a metal or metal alloy, the phosphoric acid forms an inorganic phosphate coating that is rich in free hydroxyl groups. Like the transition metal monophosphate and polyphosphate coatings, the hydroxyl groups are available for further chemical modification. In each circumstance, the modification may be performed to introduce moieties for the attachment of chemical precursors of bone tissue proteins. For example, thiol compounds known to promote bone adhesion to gold metal implants may be covalently attached to the hydroxyl groups to form covalent linkages with bone tissue protein eliminating the need for the gold metal.

Transition metal oxide passivating coatings may also be formed by thermolysis or hydrolysis of the transition metal alkoxide surface layer, without first forming an organic ligand surface layer. The present invention therefore also includes an additional embodiment wherein there is provided a method of forming a transition metal oxide coating on an oxide-bearing surface, which method includes the steps of:

providing a hydroxide-bearing surface having a surface layer of alkoxides of transition metals selected from Group IVB, Group VB or Group VIB of the Periodic Chart covalently bonded thereto, wherein the alkoxides are bonded at the transition metal atoms to the surface hydroxides of the substrate overlayer; and thermolyzing or hydrolyzing the transition metal alkoxides, so that a transition metal oxide coating is formed on the substrate surface, covalently bonded to the surface hydroxides of the substrate.

The present invention thus provides a novel type of interface that enables strong adhesion between a hydroxide-bearing surface and a ligand coating. The carboxylic acid ligands of the present invention have potential applications for structural surfaces as passivating coatings, providing paints or other passivating films with improved adhesion, or as lubricants. The organic coatings may undergo further synthesis to provide a thermal barrier or an electroactive material for electronics applications. The pi-electron delocalized ligand coatings of the present invention form electrically conductive layers without further treatment and have potential end uses as electroactive materials for electronics applications without further modification.

Furthermore, the present invention incorporates the discovery that the phosphate and phosphonate coatings of the present invention that are covalently bonded to the surface of an implantable medical device enhance the adhesion of bone tissue to the surface of the device. This is particularly useful for securely bonding replacement joints to bone tissue, as in the case of knee and hip replacements. Therefore, in addition to the coatings of the present invention, the present invention also provides methods for forming the coatings, coated implantable medical devices, methods for improving the adhesion to bone tissue of implantable medical devices, and methods for implanting medical devices by first coating them according to the present invention.

Other features of the present invention will be pointed out in the following description and claims, which disclose, by way of example, the principles of the invention and the best methods which have been presently contemplated for carrying them out.

DETAILED DESCRIPTION OF THE PREFERRED EMBODIMENTS

The ligand surface layers according to the present invention are formed by reacting a hydroxide-bearing substrate having a transition metal alkoxide surface layer with a compound capable of reacting with the transition metal alkoxide to form a covalent bond between a ligand of the compound and the transition metal. The transition metal is selected from Group IVB, Group VB or Group VIB of the Periodic Chart. The alkoxides of this layer are covalently bonded by the transition metal to the surface hydroxides of the substrate.

By reacting compounds with the transition metal alkoxide layer, transition metal ligands form as a layer on the substrate surface, covalently bonded at the transition metal to the surface hydroxides of the substrate. The conditions under which the compounds are reacted with the transition metal alkoxide surface layer of the hydroxide-bearing substrate are not critical, and may be performed at ambient temperature and pressure. For example, a substrate having a transition metal alkoxide coating may be immersed in a solution containing an excess quantity of a compound such as a solution of a carboxylic acid, phosphoric acid, phosphonic acid or a suitable pi-electron delocalized compound in a non-polar solvent such as iso-octane. A dilute solution concentration of the compound should be employed, typically between about 1.0 mM and about 100 mM. The substrate will then be removed from the solution, rinsed with the iso-octane solvent, or another non-reactive solvent, and then dried to provide a substrate having an organic ligand surface layer.

Preferably, the compound is deposited on the transition metal alkoxide layer of the substrate using conventional vapor deposition techniques and equipment. The strength of the vacuum to be applied will depend upon the vapor pressure of the compound. Compounds with low vapor pressures will require a high vacuum.

Otherwise, ambient temperatures are employed, and an excess of the compound should be used to insure a complete reaction. Preferably, the transition metal alkoxide layer of the substrate should not be exposed to ambient moisture prior to being reacted.

The reaction proceeds by the transfer of a proton from the compound to the alkoxide of the transition metal, forming the corresponding alkanol and the ligand of the transition metal. Once the reaction is complete, the vacuum is maintained in order to draw off any excess of the compound and the alkanol byproduct.

Suitable compounds include, but are not limited to carboxylic acids, phosphoric acid, phosphonic acids and pi-electron delocalized compounds capable of reacting with a transition metal alkoxide to covalently bond a ligand of the compound to the transition metal. For purposes of the present invention "phosphoric acid" is defined according to its' well-understood meaning, $H_3PO_4$. "Phosphonic acid" refers to compounds having the formula $H_2RPO_3$, wherein R is a hydrocarbon ligand with a carbon directly bonded to phosphorus.

Phosphoric acid coatings are covalently bonded as phosphate monoesters of the transition metal. The phosphate ligands may be hydrolyzed to form inorganic transition metal polyphosphate coatings on the substrate surface. The phosphate and polyphosphate coatings are rich in hydroxyl groups that are available for further chemical modification.

The inorganic transition metal phosphate monoesters also serve as a template for first chemical, then biological growth of bone tissue hydroxyapatite in the implant surface. Surface-bound inorganic transition metal phosphate monomeric units insinuate themselves directly into bone tissue hydroxyapatite to make a strong composite seal between the implant surface and the hydroxyapatite. Alternatively, the monoesters may be hydrolyzed to form inorganic transition metal polyphosphates having a two-dimensional structure, the monomeric units of which also insinuate themselves directly into bone tissue hydroxyapatite.

Essentially any organic carboxylic acid or phosphonic acid capable of forming a thin film on a hydroxide-bearing surface is suitable for use with the present invention. The carboxylic acids may be saturated or unsaturated, branched or unbranched, substituted or unsubstituted, and may be aromatic or non-aromatic. One example of a substituted carboxylic acid is a halogen-substituted carboxylic acid, with the preferred halogen being fluorine.

The carboxylic acid may be a monocarboxylic acid, dicarboxylic acid, or an anhydride of a dicarboxylic acid. Typical carboxylic acids will contain between 2 and 20 carbon atoms (exclusive of the carbonyl carbon), and preferably will contain between 3 and 18 carbon atoms. Stearic acid is one of the preferred carboxylic acids.

A preferred class of carboxylic acids are unsaturated carboxylic acids, which, after formation of the organic ligand surface layer may be polymerized to form polymeric surface layer. A preferred class of unsaturated carboxylic acids are the vinyl carboxylic acids such as acrylic acids, methacrylic acid, maleic acid, and the like. Halogen-substituted acrylates are preferred, particularly chlorine and fluorine, so that the resulting surface layer can be fully polymerized to obtain a poly (vinyl chloride) or fluoropolymer coating. Cinnamic acid could also be employed, so that the resulting surface layer could be fully polymerized to obtain a polystyrene coating.

Like the carboxylic acids, the phosphonic acid will have a hydrocarbon ligand that may be saturated or unsaturated, branched or unbranched, substituted or unsubstituted, and may be aromatic or non-aromatic. Typical hydrocarbon ligands of phosphonic acids will contain between two and twenty carbon atoms and preferably will contain between three and eighteen carbon atoms. Stearyl ligands are preferred.

A preferred class of ligands for phosphonic acids are omega-functionalized ligands that can be chemically transformed to react and covalently bond to chemical precursors of bone to protein, or the bone protein itself. Preferred omega functional groups include amino, carboxylate and thiol groups.

Essentially any pi-electron delocalized compound capable of reacting with a transition metal alkoxide to covalently bond a ligand of the ring compound to the transition metal is suitable for use with the present invention. Particularly useful compounds are pi-electron delocalized aromatic ring compounds. A particularly preferred aromatic ring compound is a phenol, which has a relatively acidic hydrogen that is readily transferred to the transition metal alkoxide to initiate a reaction that results in the formation of a transition metal phenolate. Five-membered heteroaromatic ring compounds having proton-donating ring substituents capable of reacting with the transition metal alkoxide are also desirable because of their high degree of pi-electron delocalization. Examples of such rings include furan, thiophene and pyrrole.

The hydroxide-bearing substrate having a transition metal alkoxide surface layer that is reactive with an organic compound to produce the organic ligand surface layers of the present invention is obtained by reacting the substrate with a transition metal polyalkoxide. Alkoxides of transition metals selected from Group IVB, Group VB and Group VIB of the Periodic Chart are suitable for use with the present invention, with Group IVB transition metals being preferred. Titanium (Ti) and Zirconium (Zr) are the preferred Group IVB transition metals, with Zr being most preferred.

Depending upon the position of the transition metal on the Periodic Chart, the transition metal alkoxide will have from two to six alkoxide groups. Preferred alkoxide groups have from 2 to 4 carbon atoms, such as ethoxide, propoxide, iso-propoxide, butoxide, iso-butoxide and tert-butoxides. Transition metal tetra-alkoxides are preferred, with the most preferred transition metal tetra-alkoxide being zirconium tetra tert-butoxide.

With Group IVB transition metal tetra-alkoxides, at least one of the alkoxide groups reacts with surface hydroxyls of the substrate to form covalent bonds between the surface hydroxyls and the transition metal. The reaction proceeds by proton transfer from the surface hydroxyls to an alkoxide group of a transition metal, producing an equivalent quantity of the corresponding alkanol. At least one alkoxide group does not react and remains available for reaction with organic compounds.

Group VB transition metals form penta-alkoxides and oxotrialkoxides that are suitable for use with the present invention. Both types of compounds also react by proton transfer to covalently bond the transition metal to substrate hydroxyls and produce an equivalent quantity of an alkanol byproduct. At least one alkoxide group does not react and is available for subsequent reaction with an organic compound. Group VB transition metals also form dioxo-monoalkoxides, which, if basic enough, will react with an acidic compound.

Group VIB transition metals form hexa-alkoxides, oxo-tetraalkoxides and dioxo-dialkoxides that are all suitable for use with the present invention. These compounds also react by proton transfer to covalently bond the transition metal to substrate hydroxyls, producing an equivalent quantity of an alkanol and leaving at least one unreacted alkoxide group for subsequent reaction with organic compounds.

Advantageously, many of the transition metal alkoxides suitable for use with the present invention are commercially available. This includes the preferred zirconium tetra tert-butoxide, which may be obtained from Aldrich Chemical. However the transition metal alkoxides may also be prepared by conventional techniques by reacting a halide or oxo-halide of the selected transition metal, depending on the desired number of alkoxide groups, with the corresponding alkoxide of a metal selected from Group I or Group II of the periodic chart.

The substrate may be reacted with the transition metal alkoxide by immersion in a dilute (1.0 mM to 100 mM) solution of the alkoxide in a non-reactive solvent, such as a lower alkane like iso-octane, a lower di-alkyl ether or tetrahydrofuran (THF). Or, again, the reaction may also be performed by vapor deposition. In both instances, an excess of transition metal alkoxide is employed, and the reaction then performed at ambient temperature. With solvent immersion, when the reaction is complete, the transition metal alkoxide layer obtained is rinsed with a solvent such as a lower alkane like iso-octane, a lower dialkyl ether, THF, and the like, and then dried. With vapor deposition, upon completion of the reaction the vacuum should once again be maintained to remove excess transition metal alkoxide and alkanol byproduct.

As noted above, the transition metal alkoxide layer formed on the substrate preferably should not be exposed to ambient moisture before being reacted with an organic compound. Therefore, a particularly preferred reaction is a two-stage vapor deposition process in which the transition metal alkoxide is first vapor deposited on the substrate. When the reaction is complete, vacuum is applied to remove excess transition metal alkoxide and alkanol by-product, which is then followed by vapor deposition of the organic compound, so that the transition metal alkoxide layer on the substrate is never exposed to ambient moisture. Upon completion of the reaction with the organic compound, the vacuum is then applied to withdraw excess organic compound and alkanol byproduct.

Substrates suitable for use with the present invention include any metal or metalloid capable of forming a native oxide overlayer, and essentially any substrate capable of being provided with an oxide overlayer coating by conventional techniques. The substrate may thus be a metal, alloy or metalloid with an actual native oxide overlayer, or a metal alloy or metalloid having an oxide overlayer physically produced by well-known oxidative conditions such as exposure to air and/or moisture. Dental and orthopedic implant substrates include titanium and alloys thereof such as Ti-6A1-4V. A non-metal or non-metalloid substrate such as a composite material may also be employed having an oxide of a metal deposited thereon by sputtering or having a silicon oxide overlay produced by applying a sol-gel to the substrate. Metal oxides may also be deposited on a metal or metal alloy substrate by sputtering.

The metal substrates on which oxide overlayers may be physically produced may be single or mixed metal materials. The preferred single metal substrates include aluminum and iron. Preferred substrates for bone implants include titanium and alloys thereof. Polymeric and ceramic materials may also be functionalized to covalently bond with transition metal alkoxides.

Indium tin oxide (ITO) is a non-native mixed metal oxide preferred for electronics end-use applications involving, for example, electrode processes. ITO is preferably applied to substrates by conventional techniques, such as sputtering. The preferred metalloid is silicon.

As noted above, the method of the present invention may be employed to prepare surface layers of polymerizable unsaturated carboxylic or phosphonic acids, such as acrylic phosphonic acid that may be subsequently polymerized to form a polymeric coating on the substrate. Unexpectedly, when acrylic acid and methacrylic acid are employed, the polymerization proceeds spontaneously upon exposure to air. For less reactive coatings, the polymerization can be performed by exposing the coating to conventional polymerization reagents and conditions.

The present invention also includes inorganic phosphate and organic phosphonate coatings that have been directly covalently bonded thereto. Inorganic phosphate coatings are prepared by coating metal-containing and metal alloy-containing substrates with a concentration of phosphoric acid effective to form a stable film on the substrate surface without excessively dissolving the substrate. This can readily be determined by those of ordinary skill in the art without undue experimentation. Phosphoric acid having a concentration between about 1.4 and about 2.8 M is preferred. Phosphonic acid coatings are similarly directly applied to a hydroxide-bearing substrate. These embodiments of the present invention advantageously eliminate a complicated process step requiring protection of a transition metal alkoxide coating layer from ambient moisture prior to the vacuum deposition.

The substrate is then heated to a temperature between about 40 and about 140° C., with a temperature of about 90° C. being preferred. Phosphate and phosphonate ligands then directly covalently bond to the substrate. The phosphonic acid ligands also polymerize to form organopolyphosphonate covalently bonded coatings.

Like the transition metal phosphate monoester and polyphosphate coatings, the inorganic phosphate coatings are rich in free hydroxyl groups. Each coating layer may be further functionalized to promote covalent attachment to bone tissue proteins, or precursors thereof, for example, by using thiol compounds conventionally employed to promote adhesion between gold metal implants and bone tissue. The hydrocarbon ligands of the organopolyphosphonate coatings may likewise be functionalized at the omega carbon as described above for phosphonate ligand coatings to form covalent bonds with chemical precursors of bone tissue protein or with the bone tissue protein itself.

The method of the present invention may also be employed to prepare passivating transition metal oxide coatings having improved substrate adhesion. Such transition metal oxide coatings are obtained by reacting the organic ligand coatings of the present invention with a basic solution capable of hydrolyzing the transition metal ligand, such as a 0.001 N to about a 1.0 N solution of a caustic material such as NaOH, KOH, $NH_4OH$, and the like. Lewis bases capable of hydrolyzing the organic ligands may also be used. The transition metal alkoxide coatings may also be directly converted to transition metal oxide coatings, without first forming an organic ligand coating, by thermolysis of the transition metal alkoxide coatings at temperatures above 300° K, preferably between about 400° K and about 500° K.

The phosphate and phosphonate coatings of the present invention are advantageously employed to provide osteoconductive surfaces for dental and osteopathic implants that exhibit improved adhesion at the bone tissue interface. The coatings can be applied to essentially any implant intended for bone or dental tissue contact fabricated from a material having a hydroxide-bearing surface at the intended bone or cental tissue interface. Implants made of titanium and alloys thereof may be employed, as well as aluminum or iron, and alloys thereof, and the like. Plastic polymer and ceramic materials with hydroxyl group-modified surfaces at the bone tissue interface may also be employed.

Ligand replacement reactions in the coordination sphere of surface transition metal complexes also make it possible to attach bio-compatible or bio-active organic co-polymers to implant surfaces. The purposes can range from implant lubrication or reduction of adhesion to the delivery of organic phase-soluble drugs at the implant-bone tissue interface.

The new methodology of the present invention enables strong adhesion between a dental or osteopathic implant and incipient bone tissue via a network of strong chemical bonds. Implant devices can be fabricated and surface processed ex-situ to assemble composite coatings on the implant surfaces that will give rise to a strong, non-fracturable bone-to-implant seal following implantation. The methodology is amenable to vapor-phase or solution-phase (aerosol spray-on) chemistry and proceeds under mild conditions, especially compared to plasma or laser-induced deposition.

The following non-limiting examples set forth hereinbelow illustrate certain aspects of the present invention. They are not to be considered limiting as to the scope and nature of the present invention. In the examples which follow, all parts are by weight.

EXAMPLES

All reagents were obtained from Aldrich Chemical unless otherwise noted. Propionic acid (99+ percent), octanoic acid (99.5+ percent) and stearic acid (99.5+ percent) were used as received. Tetra(tert-butoxy) zirconium (TBZ) was distilled at $10^{-1}$ torr and 80° C. The distilled product was stored in a nitrogen dry box, in the dark, and at −40° C. until needed. Otherwise, solvents were used as purchased. Quartz crystals were obtained from Valpey Fisher, Inc. (5.5 Mhz, ¾ inch diameter, 3 micron fine polish). Aluminum wire used for the deposition of the aluminum substrates was obtained from Alfa (1 mm diameter, 99.999 percent pure).

Infrared experiments were performed in a Nicolett 730 FT-IR Spectrometer. The glancing angle attachment used, a Variable Angle Specular Reflectance Model 500, was obtained from Spectra Tech. The angle between the surface normal and the incident beam was approximately 87°. The sample was purged with nitrogen for half an hour to reduce the amount of water on the surface. 1,000 scans were needed to obtain a reasonable signal to noise ratio. All spectra obtained were ratioed against a spectrum of a clean aluminum oxide surface. The contact angles were measured at room temperature and ambient conditions on a Tantec Contact Angle Meter CAM-F1.

Quartz crystals (5.5 MHz) were cleaned before use by soaking first in concentrated, aqueous NaOH, then concentrated $H_2SO_4$, followed by copious rinsing with distilled water. The crystals were then oven-dried. Electrodes were vapor-deposited onto the crystals using an Edwards Coating System E306A operating at $<10^{-6}$ torr. Electrodes were prepared as 200 nm aluminum layers deposited directly onto the quartz crystals; the geometrical electrode overlap area, on the basis of planar measurement was 0.27 $CM^2$. Air was admitted into the chamber after aluminum deposition, and the quartz crystal microbalance (QCM) electrodes were further hydroxylated by being exposed to water vapor at 80° C. for four hours. Hydroxylated QCM electrodes were evacuated for approximately 15 hours and were stored in the dry box prior to use. Profilimetry, scanning electron microscopy imaging, and an optical micrograph of the oxidized QCM electrodes all showed qualitatively rough surfaces.

The quartz crystal microbalance (QCM) was driven by a home-built Clapp oscillator and powered by a Hewlett Packard 6234A Dual Output Power Supply. The frequency of the crystal was measured using a Hewlett Packard 5334B Universal Counter and a record of the frequencies was tracked using a laboratory computer. A change in the observed frequency indicated a change in the mass of the crystal. To insure that all the frequency changes were attributable to the deposition of the reactants, the frequency of the crystal was monitored before and after exposure to reactants.

Comparative Example

The reproduction of the documented formation of self-assembled monolayers on aluminum oxide in an iso-octane solution, using stearic acid was accomplished successfully. A 1.0 mM solution of stearic acid was prepared for deposition on fresh aluminum films. The aluminum substrates were immersed in the solution for 24 hours, then washed with fresh iso-octane. The presence of a stearic acid film was confirmed by IR spectroscopy. The self-assembled monolayer alignments were confirmed by contact angle measurements. Washing the substrates after they were immersed in the carboxylic acid solutions aided in the removal of molecules that were not bound to the aluminum, but were merely sitting on the surface.

The films formed in solution were not very stable. The stearic acid film, which formed in 24 hours, was removed by anhydrous ethyl ether under mild conditions in the same amount of time. The monolayer-coated aluminum substrate was placed in the ether at room temperature without using any stirring device. Removal of a significant portion of the film within 90 minutes was confirmed by IR spectroscopy. After removing the monolayer, it was possible to establish another monolayer on the aluminum surface by repeating the same technique. This could be done repeatedly, but there was a gradual erosion of the aluminum substrate.

From the IR information, it was apparent that the interaction between the carboxylic acid and the metal oxide substrate surface was weak, as illustrated by the ability to produce and remove the monolayer under mild conditions. The nature of the interaction is apparently hydrogen bonding between the acid and the hydroxyls on the surface of the metal. Apparently, covalent bonds are not formed because, if they were, much more vigorous conditions would be required to remove the carboxylic acid from the surface of the metal oxide.

Example 1

Preparation of Quartz Crystal Microbalance Electrodes

An evacuable reaction chamber equipped with two separate inlet ports was used. A QCM electrode ensemble was assembled within the chamber and connected via ports to a power supply and frequency recorder. Distilled TBZ (ca. 300 mg) was placed in a small vial attached to one port via a high-vacuum stopcock, and octanoic acid (ca. 300 mg) was placed in a second small vial attached to the other inlet port via a high-vacuum stopcock. Both were degassed by three freeze-pump thaw cycles. The assembly was isolated from the two organic reagents and was evacuated for two hours at ca. $10^{-5}$ torr. With the vessel opened to the vacuum system, the QCM was exposed to TBZ by opening the appropriate stopcock. After reaction with the electrode surface was complete as measured by the QCM, the TBZ-containing vial stopcock was closed, and the QCM-containing vessel was evacuated at ca. $10^{-5}$ torr for approximately one hour.

Following reaction of the QCM surface with TBZ, the octanoic acid-containing vial stopcock was opened and the treated QCM surface was exposed to octanoic acid vapor. After reaction with the electrode surface was complete as measured by the QCM, the QCM-containing vessel was evacuated for ca. three hours.

Pre-cleaned glass slides (VWR Scientific) were deposited with aluminum electrodes as described above for QCM crystals. The slides were then reacted with TBZ and octanoic acid as described above for QCM crystals.

Changes in QCM frequency confirmed the sequential deposition of TBZ and octanoic acid on the QCM electrode surfaces. A frequency change corresponding to loss of coating weight did not occur when the coated QCM electrode was maintained in the evacuated chamber.

IR spectroscopy confirmed the presence of a zirconium octanoate film on the surface of the aluminum oxide-coated slides. Self-assembled monolayer alignments were confirmed by contact angle measurements. IR analysis of the zirconium octanoate films showed no significant changes after two months of exposure to ambient conditions, nor was any significant change noted in the IR spectrum of a film washed in anhydrous diethyl ether for 24 hours, as in comparative Example 1 or in $10^{-3}$ M octanoic acid in diethyl ether for ten minutes.

Comparative Example 2

A procedure similar to that described in Experimental Example 1 was performed using a single exposure of a QCM electrode ensemble to octanoic acid, without first exposing the electrode to TBZ. The QCM frequency was monitored throughout the sequence.

When the vacuum was closed, and the QCM electrode exposed to octanoic acid vapors, the initial changes in frequency indicated that an octanoic acid film had formed on the aluminum oxide surface of the electrode. When the vacuum was re-opened, however, the frequency returned to its original value and negated any significant change. Thus, if there was any type of film formed, it was adhered to the metal oxide surface by a weak force. The strength of the re-opened vacuum was able to overcome any interaction that the octanoic acid could establish with the metal oxide surface.

The QCM experiments showed convincingly that the octanoic acid was not forming stable films on the aluminum oxide surface. The addition of the TBZ to the aluminum oxide surface made a significant difference in the stability of the carboxylic acid films. The TBZ was reactive with the aluminum oxide, as shown by the large net frequency change. The reactivity of the octanoic acid was enhanced by the presence of the zirconium interfacial complex. The net changes in frequency when a zirconium interfacial complex was present was much greater than when there was a clean oxide surface, for the same period of time.

The use of a zirconium interfacial complex also made a more stable organic film than the films made by the octanoic acid alone. The octanoic acid films made on the TBZ precursor were not removed by vacuum, like the films directly formed on clean aluminum substrates.

Example 2

Deposition of Methacrylic Acid Onto Zirconium/aluminum Oxide Interface

The reaction of TBZ with an oxidized aluminum-coated glass slide was performed as in experimental Example 1. The surface bound species was exposed to vapor of methacrylic acid at room temperature. IR analysis of the resulting material was taken in air. Bands associated with the tert-butoxy group were absent, and new peaks, at 2929, 2858, 1541 and 1457 cm$^{-1}$ were recorded, indicative of an alkylcarboxylate overlayer. No olefinic peaks were observed. The overlayer was, therefore, polymerized methacrylate.

Example 3

Deposition of Perfluorooctanoic Acid Onto the Zirconium/aluminum Oxide Interface The reaction of TBZ with an oxidized aluminum-coated glass slide was performed as in Example 1. The surface bound species was exposed to vapor of perfluorooctanoic acid at room temperature and 10$^{-5}$ torr. IR analysis of the resulting material was taken in air. Bands associated with the tert-butoxy group were absent, and new peaks, at 1640, 1450 (carboxylate), 1245 and 1218 (perfluoroalkyl) cm$^{-1}$ were recorded, indicative of an alkanecarboxylate overlayer.

Example 4

Preparation of Zirconium Oxide Overlayer on Aluminum Oxide by Hydrolysis of a Zr Alkane Carboxylate or Zr Perfluoroalkane The Zr alkane carboxylate and Zr perfluoroalkane carboxylate films of Examples 2 and 3 on oxidized aluminum were exposed to 0.01 N NaOH in water. The resulting product was washed with water. Scanning electron microscopy elemental analysis showed that ZrO$_2$ had formed on the surface.

Example 5

Preparation of a Zirconium Oxide Overlayer on Aluminum Oxide by Thermolysis of Surface (Tert-butoxy) Zirconium Species The reaction of TBZ with oxided aluminum was performed at room temperature and under reduced pressure. Elemental analysis of the resulting material showed di(tert-butoxy) zirconium/oxided aluminum when the aluminum surface was previously heavily exposed to water. Elemental analysis of the resulting material showed tri(tert-butoxy) zirconium/oxided aluminum when the aluminum surface was previously lightly exposed to water. Both classes of surface TBZ species underwent thermolysis above 300° K. IR analysis in each case showed complete loss of the tert-butoxy groups. Elemental analysis showed ZrO$_2$ remained on the surface.

Example 6

Preparation of Zirconium Alkoxide Overlayer on Indium Tin Oxide

Indium tin oxide (ITO) coatings were deposited on glass laboratory slides by conventional sputtering techniques. The reaction of TBZ with the ITO-coated glass slide was performed as in experimental Example 1. IR analysis showed the formation of di(tert-butoxy) zirconium/ITO.

Example 7

Preparation of Zirconium Carboxylate Overlayer on Indium Tin Oxide

The surface bound TBZ of the TBZ/ITO coating of Example 6 was exposed to vapor of octanoic acid as in experimental Example 1. IR analysis showed the formation of zirconium-di(octanoate)/ITO.

The results obtained in the foregoing examples indicate a general method for adsorption enhancement of organic self-assembled monolayers onto any hydroxylated oxide film of a metal, alloy or metalloid capable of reaction with a transition metal alkoxide.

Examples 8–14

General. Titanium (0.25 mm; 99.6%), aluminum (0.25 mm; 99.0%); and iron (0.125 mm; 99.5%) foils (all obtained from Goodfellow, Inc.) were sanded and cleaned with methanol, cut into ca. 1 cm×1 cm samples, and stored in an oven at 200° C. The Ti foil was also used for ultrahigh vacuum (UHV) studies, in which background data were collected using a sample that had been rinsed with THF and evacuated at room temperature. The UHV chamber contained a Mattson Research Series FT-IR spectrometer, a quadrupole mass spectrometer (QMS), and an X-ray photoelectron spectrometer (XPS). TBZ was distilled as in Examples 1–7. Aerosol spraying of solutions of phosphoric acids was performed in a simple glove box under a N$_2$ flow. "Peel" tests were performed by pressing a strip of red Scotch® "650" tape onto a substrate, and then rapidly peeling the tape off.

Example 8

Preparation of Surface [Ti]—[ ]—Zr(OBu$^t$)$_3$. A Ti foil sample was exposed to TBZ vapor at 10$^{-2}$ torr in five "cycles" of alternating exposure for 15 min with external evacuation applied, followed by 30 min without such evacuation. The sample was then evacuated at 10$^{-2}$ torr for 1 hr to remove any surface physisorbed TBZ. Diffuse reflectance Fourier transform (DRIFT) infrared analysis confirmed the formation of Ti-2 (v$_{CH3\ asym}$=2977 cm$^{-1}$).

Example 9

Surface [Al]—[O]—Zr(OBu$^t$)$_3$. Aluminum foil samples were exposed to TBZ vapor for three "cycles" and analyzed by DRIFT, as described for Example 8.

Example 10

Surface [Fe]—[O]—Zr(OBu$^t$)$_3$ Iron foil samples were exposed to TBZ vapor for five "cycles" and analyzed by DRIFT, as described for Example 8.

Example 11

Surface [Ti]—[ ]—Zr(OBu$^t_2$)HO]PO$_2$C$_{18}$H$_{37}$). A solution of 0.8 mM octadecanephosphonic acid was prepared in dry tetrahydrofuran and was sprayed in a fine aerosol mist using N$_2$ and a TLC sprayer (Supelco) onto both the coating of Example 8 and a control sample foil. Samples were then evacuated at 0.1 torr overnight to remove solvent, and were then analyzed by DRIFT.

Example 12

Surface [Al]—[O]—Zr(OBu$^t$)$_x$([HO]PO$_2$C$_{18}$H$_{37}$)$_{2-x}$. This material was prepared as described for Example 11 using the coating of Example 9, and was then analyzed by DRIFT.

Example 13

Surface [Fe]—[O]—Zr(OBu$^r$)$_X$([HO]PO$_2$C$_{18}$H$_{37}$)$_{2-x}$. This material was prepared as described for Example 12 using the coating of Example 10, and was then analyzed by DRIFT.

Example 14

Ex situ-prepared [Ti]—[O]—Zr(OBu$^r$)$_1$([HO]PO$_2$CH$_3$)$_2$ in UHV. A coating was prepared and washed three times with THF in the glove box as described above for Example 11. The sample was then mounted into the manipulator of the UHV apparatus under ambient conditions. No attempt was made to blanket the apparatus under N$_2$ during this transfer, and the sample was exposed to the atmosphere for ≈5 min. The UHV apparatus was then sealed and evacuated, without baking, for four days, until a background pressure of <10$^{-9}$ torr was established. No cleaning of the substrate by Ar$^+$ sputtering was attempted.

Results and Discussion

In a typical experiment, a sample of a metal foil was exposed to vapor of TBZ at 10$^{-2}$ torr. The synthetic sequence consisted of alternating substrate exposure with external evacuation applied (15 min), followed by a period (30 min) without external evacuation. Finally, samples were subjected to 10$^{-2}$ torr (1 hr) to remove physisorbed TBZ.

The presence of surface alkoxyzirconium complexes after evacuation was confirmed by diffuse reflectance FT-IR (DRIFT), and surface loadings (multilayer or monolayer) were qualitatively determined from DRIFT reflectivities (>1% and <1%, respectively). Monolayer surface alkoxyzirconium substrates were then treated with an aerosol of the alkanephosphonic acid in THF (0.8 mM) under dry N$_2$. Substrates were reexamined by DRIFT to determine the presence of phosphonate species, either as multilayers of the acid, or as surface zirconium phosphonate complexes formed by protolytic metathesis (Scheme 8), or both. Each sample was then washed with THF to remove physisorbed phosphoric acid and was reanalyzed by DRIFT.

A simple "peel" test can provide a qualitative comparison between the adhesion of layers in a composite and the adhesive strength of the tape used. Therefore, red Scotch® "650" tape "peel" tests were performed on each washed sample, and resistance to peeling was determined qualitatively by DRIFT. Control samples (with no alkoxyzirconium complex interface) were also aerosol-treated with a solution of the phosphoric acid, and were tested for stability to washing with THF or tape peeling.

Aluminum

Aluminum is easily oxidized and heavily hydroxylated upon contact with moist air; TBZ reacted readily with the hydroxylated aluminum oxide surface to give the surface of Example 9 which displays a strong, characteristic IR peak at 2977 cm$^{-1}$ ($v_{asynCH3}$) The "zirconated" surface was then treated with n-octadecanephosphonic acid (ODPA) in a THF aerosol. DRIFT analysis of the reaction product between the surface of Example 9 with ODPA showed a characteristic long alkyl chain pattern for the resulting Example 12 surface, with peaks at 2850 ($v_{asymCH2}$), 2920 ($v_{asymCH2}$) and 2958 ($v_{asynCH3}$) cm$^{-1}$ ($v_{asynCH3}$ not discernible). Control samples were prepared by spraying the phosphoric acid solution onto an "unzirconated" strip of ambient-hydroxylated Al foil, followed by solvent evaporation to give a surface coated with a multilayer of the phosphoric acid (major peaks at 2848, 2915 and 2957 cm$^{-1}$; vSymcH3 were not discernible). Both surfaces were then washed by immersion in THF for five minutes followed by solvent removal by evacuation; in this way, any physisorbed or weakly chemisorbed ODPA would be washed off the substrate, and only strongly bonded phosphonates would remain. The Example 12 coating showed significant alkanephosphonate remaining following two THF washing cycles. ODPA was more readily, but not completely, removed from control samples (by IR analysis), especially after two cycles of THF wash; chemisorbed material might be present on the control sample as a surface aluminum phosphonate. "Peel" tests were performed on THF-washed Example 12; coating; no significant loss of alkanephosphonate was noted by IR analysis. In contrast, essentially all the alkanephosphonate that survived two THF wash cycles for the control sample was easily "peeled" away.

Iron

Results using an iron substrate were similar to those found for alumino, even though the surface of iron is apparently not as heavily hydroxylated as aluminum. Iron foil was treated with TBZ for 5 "cycles" of exposure and evacuation to give the Example 10 coating. Then ODPA was THF aerosol-sprayed onto the Example 10 coating, and the solvent was removed by evacuation to obtain the Example 12 coating. A control sample was prepared by spraying the phosphoric acid solution onto an "unzirconated" strip of ambient-hydroxylated Fe foil, followed by solvent evaporation. IR analysis showed the typical peaks for multilayer phosphonates on the Example 12 coating and the control sample (2848, 2918, 2952 cm$^{-1}$). THF washing of the Example 12 coating resulted in only a small change in IR peak intensity, as did a "650" tape peel test performed after THF rinse. THF wash and wash/"peel" tests on the control sample showed comparable results.

Titanium

Titanium, as aluminum, is easily surface-oxidized by ambient exposure. It does not, however, form a heavily hydroxylated oxide layer, and alkanephosphonic acids do not react as readily with bulk TiO$_2$ as with Al$_2$O$_8$, although both oxides form phosphates under hydrothermal processing conditions. The zirconium-interfaced species of Example 10 was prepared from TBZ and ambient condition-hydroxylated Ti foil by 5 "cycles" of exposure and evacuation. ODPA in THF solution was then sprayed onto the Example 18 coating, and the solvent was removed by evacuation to obtain the Example 13 coating. Control samples were prepared by spraying the phosphoric acid solution onto an "unzirconated" strip of ambient-hydroxylated Ti foil, followed by solvent evaporation. DRIFT-IR analysis of the Example 13 coating showed an aliphatic VC-H pattern expected for multilayer coverage by the ODPA (and the control Example 13: 2850, 2921, 2960 cm$^{-1}$; Control: 2847, 2916, 2954 cm$^{-1}$). Washing the Example 13 coating with THF removed physisorbed ODPA and left surface-complexed phosphonate, and a "650" peel test performed on the washed Example 13 coating also resulted in negligible decrease of IR signal intensity. In stark contrast to results for Al and Fe substrates, a single THF washing of the control resulted in nearly complete loss of the IR signal for the ODPA.

Structural Correlations

The position of the IR band assigned to ($v_{asynCH2}$) has been discussed as a means to identify ordered vs. disordered alkanephosphonate chains on bulk oxide substrates. For each zirconated alkanephosphonate substrate, a shift in the position of this band from frequencies associated with "ordered" to those of "disordered" alkyl chains was noted on THF washing of Al and Ti substrates (for Al: 2920 before rinse, 2925 after rinse; Ti: 2921 before rinse, 2925 after rinse; Fe: 2918 cm$^{-1}$, before and after rinse). The appearance of the "P—O" region of the IR (1300–800 cm$^{-1}$). has been discussed, too, as a probe of the coordination of the phosphonate "head group" with a metallic oxide surface. The IR of ODPA exhibits sharp peaks at 1220 and 950 cm$^{-1}$, assigned to P=O and P—OH, respectively, and group $V_{PO3}$ vibrations at 1074 and 1010 cm$^{-1}$. The spectrum of multilayer ODPA on the Ti native oxide surface closely resembles that of the acid, minus the 1220 cm$^{-1}$ peak. In contrast, the spectrum of multilayer ODPA on the zirconated Ti surface shows new, sharp peaks at 906, 975, and 1260 cm$^{-1}$. The peak at 1012 cm$^{-1}$ is still present, but a new, broad peak centered around 1060 cm$^{-1}$, which has been attributed variously to terminal or bridging, multidentate phosphonate-metallic ion interactions, is prominent. The spectrum of THF-washed and "peel"-treated Example 14 surface has absorption at 1260 cm$^{-1}$ and a broad band centered at 1075 cm$^{-1}$.

XPS Determination of Stoichiometry

Triplicate samples of the Example 14 coatings were prepared in the glove bag from the Example 18 coating and an aerosolsprayed solution (0.5 mM) of methanephosphonic acid in THF (for Example 14, $v_{C-H}$=2925 cm$^{-1}$) and were rinsed three times with THF to remove physisorbed methanephosphonic acid. The samples were then mounted into the manipulator of the UHV apparatus; no provisions were made to protect the Example 14 coatings from ambient exposure, and UHV conditions were established by evacuation at room temperature for four days. Samples of the Example 14 coatings were then analyzed by XPS, and data were compared with those obtained from a sample of Ti which had been washed with THF and which showed C(1s) peaks at binding energies (B. E.) of 286.6 and 284.1 eV and a broad O(1 s) signal centered at 531.0 eV. No attempt was made to remove background carbon or oxygen contamination from the Ti surface of the Example 14 coatings by Ar$^+$ sputtering, so as not to damage the surface complex. XPS analysis of the Example 14 coatings showed a single phosphorous peak (P[2p] at 133.0 eV; FIG. 11; c.f 134.1 eV for multilayer $CH_3P[O][OH]_2/TiO_2$, and 135.5 eV for dimethyl phosphonate/Rh[100]$^{33}$), and a complex signal for O(1s) containing at least three components, at 534.1, 532.8, and 531.0 eV; the last peak is present in the control. The Zr(3d) signal was readily deconvolved into a component for ZrO2 (Zr(3d$_{5/2}$)=182.4 eV; and one for (183.0 eV; ZrO$_2$: Example 14=1:5;). We did not assign peaks in the C(1s) spectrum of the Example 14 coatings for C—C and C—O carbons of residual tert-butoxy ligands nor for C—P of the phosphonate group because the control carbon signal entirely overlaps that for the Example 14 coating; determination of the stoichiometry for the Example 14 coatings can not be made on the basis of these carbon data. However, there is no background contamination from either Zr or P, so the measured P/Zr ratio (2.5:1) can be used for this purpose, and gives an average stoichiometry for the Example 14 coatings of close to [Ti]—[O]$_1$—Zr(OBu$^t$)$_1$(OP(O)(OH)CH$_3$)$_2$. It is interesting that ligand metathesis with alkanephosphonic acids proceeds with a stoichiometry similar to that found for carboxylic acids or phenols, which have been studied both under near-ambient conditions and in UHV.

Conclusions

Native oxides of Al and Fe, which are apparently reactive toward alkanephosphonic acids under ambient conditions (by protonation or salt formation), retain a significant amount of adsorbed phosphonic acid (perhaps as Al or Fe phosphonates) following wash or peel tests. Titanium dioxide and, evidently, the native oxide layer on Ti are relatively unreactive toward these acids at room temperature. The Ti native oxide does, however, readily react with tetra(tert-butoxy)Zr, and this surface modification reagent can be used to strongly interface the substrate metal with the organic acid. Thus, any practical qualities attributed to metal-phosphonate composites can be easily extended to include this important structural metal though the expedient of a simple surface pretreatment. The surface pretreatments find utility as osteoconductive coatings on the surface of implantable medical devices to promote adhesion to bone tissue.

Examples 15–17

Direct Deposition of Octadeclyphosphonic Acid (ODPA) on Titanium

Example 15. A 0.8 mM THF solution of ODPA in the form of an aerosol spray under dry N$_2$ was deposited on titanium foil (99.6+% annealed) under vacuum (10$^{-1}$ torr), which was maintained with the pump off for six hours.

The coating was completely washed away with one rinse.

Example 16. A 0.6 mM THF solution of ODPA was sprayed under dry N$_2$ on titanium foil (99.6+% annealed). Following solvent evaporation the sample was heated for 18 hours at 110° C. and rinsed twice with THF.

Repeating the spray-heat-rinse cycle five times produced a durable coating that did not wash away.

Direct Deposition of Phosphoric Acid on Titanium

Example 17. Titanium foil (99.6+% annealed) was immersed in 1.4M aqueous H$_3$PO$_4$ (pH=1.5) at room temperature for one hour, then heated at 110° C. for greater than 16 hours. After two rinsings with THF, a coating of Ti(H$_2$PO$_4$)$_3$ remained that could not be rinsed away.

Examples 18–26

It was discovered that immersion of cleaned titanium slides in a 1.4M H$_3$PO$_4$ bath for at least one minute, followed by oven-heating to 110° C. for at least 3 hours, was sufficient treatment to produce titanium phosphate surface compounds. A summary of the different variables tested and the effect they had on the formation of titanium phosphate surface compounds is displayed in Table I.

TABLE I

| EXAMPLE | H3PO4 | pH | Soaking Time | Heat time 110° C. | Surface Compound |
|---|---|---|---|---|---|
| 18 | 1.4 M | ~0.5 | >1 hr. | >6 hrs. | Y |
| 19 | 2.8 M | ~0 | >1 hr. | >6 hrs. | Y |
| 20 | 0.7 M | ~1 | >1 hr. | >6 hrs. | N |
| 21 | 1.4 M | ~1.5 | >1 hr. | >6 hrs. | N |
| 22 | 1.4 M | ~2 | >1 hr. | >6 hrs. | N |
| 23 | 1.4 M | ~0.5 | 1 minute | >6 hrs. | Y |
| 24 | 1.4 M | ~0.5 | >1 hr. | >6 hrs. | Y |
| 25 | 1.4 M | ~0.5 | >1 hr. | >3 hrs. | N |
| 26 | 1.4 M | ~0.5 | >1 hr. | 3–24 hrs. | Y |

The foregoing description of the preferred embodiments should be taken as illustrating, rather than as limiting, the present invention as defined by the claims. Numerous variations and combinations of the features described above can be utilized without departing from the present invention.

What is claimed is:

1. A coating layer formed on and covalently bonded to the surface of a hydroxide-bearing substrate, said coating layer comprising transition metal atoms selected from the group consisting of Group IVB, Group VB and Group VIB of the Periodic Chart which have been covalently bonded to said substrate surface by reaction of a poly alkoxide of said transition metal with the hydroxyl groups of the hydroxide-bearing substrate, wherein each transition metal atom additionally has covalently bonded to it one or more ligands of said coating layer, said ligands being further characterized in that they are selected from the group consisting of phosphates and phosphonates.

2. The coating layer of claim 1, wherein said transition metal atoms are Zr or Ti atoms.

3. The coating layer of claim 1, wherein said ligands comprise organophosphonates with a hydrocarbon moiety containing from 2 to 20 carbon atoms.

4. The coating layer of claim 3, wherein said hydrocarbon moiety is a saturated or unsaturated, substituted or unsubstituted alkyl group.

5. The coating layer of claim 4, wherein said alkyl groups are omega-substituted.

6. The coating layer of claim 5, wherein said omega-substituent is selected from the group consisting of amino, carboxylate and thiol groups.

7. The coating layer of claim 1, wherein said hydroxide bearing substrate is a metal, alloy or silicon substrate with a native oxide overlayer formed thereon.

8. The coating layer of claim 7, wherein said substrate is a metal selected from the group consisting of titanium, aluminum or iron.

9. The coating layer of claim 8, wherein said substrate is a titanium alloy.

10. The coating layer of claim 1, wherein said surface of a hydroxide-bearing substrate comprises a material selected from the group consisting of a polymeric material and a ceramic material, the material being further characterized in that the surface has been modified to comprise a hydroxide-bearing substrate.

11. The coating layer of claim 1, wherein said ligands form a self-assembled monolayer.

12. An implantable device having one or more surfaces for attachment to bone tissue, wherein at least one attachment surface comprises the coating layer of claim 1.

13. The implantable device of claim 12, comprising a knee or hip replacement joint.

* * * * *

UNITED STATES PATENT AND TRADEMARK OFFICE
CERTIFICATE OF CORRECTION

PATENT NO.    : 6,645,644 B1
DATED         : November 11, 2003
INVENTOR(S)   : Jeffrey Schwartz et al.

Page 1 of 1

It is certified that error appears in the above-identified patent and that said Letters Patent is hereby corrected as shown below:

Title page,
Item [54], Title, replace second occurrence of "PHOSPHORIC" with
-- PHOSPHONIC --.

Column 1,
Line 2, before the word "ACID" replace "PHOSPHORIC" with -- PHOSPHONIC --.
Line 8, after the word "Divisional", delete "filed Feb. 4, 1997".

Column 17,
Line 41, delete "FIG. 11".

Signed and Sealed this

Twenty-seventh Day of July, 2004

JON W. DUDAS
*Acting Director of the United States Patent and Trademark Office*